United States Patent
Weisbuch et al.

(10) Patent No.: US 7,345,298 B2
(45) Date of Patent: Mar. 18, 2008

(54) HORIZONTAL EMITTING, VERTICAL EMITTING, BEAM SHAPED, DISTRIBUTED FEEDBACK (DFB) LASERS BY GROWTH OVER A PATTERNED SUBSTRATE

(75) Inventors: Claude C. A. Weisbuch, Paris (FR); Aurelien J. F. David, Paris (FR); James S. Speck, Goleta, CA (US); Steven P. DenBaars, Goleta, CA (US)

(73) Assignee: The Regents of the University of California, Oakland, CA (US)

( * ) Notice: Subject to any disclaimer, the term of this patent is extended or adjusted under 35 U.S.C. 154(b) by 139 days.

(21) Appl. No.: 11/067,957

(22) Filed: Feb. 28, 2005

(65) Prior Publication Data

US 2006/0194359 A1 Aug. 31, 2006

(51) Int. Cl.
*H01L 29/06* (2006.01)
*H01L 21/00* (2006.01)

(52) U.S. Cl. .................... 257/13; 257/98; 438/29; 438/31; 438/32

(58) Field of Classification Search ............ 438/29, 438/31, 32, 36, 37, 69, 71, 72; 257/13, 79, 257/81, 98
See application file for complete search history.

(56) References Cited

U.S. PATENT DOCUMENTS

| | | | |
|---|---|---|---|
| 3,739,217 A | 6/1973 | Bergh et al. | |
| 5,226,053 A | 7/1993 | Cho et al. | |
| 5,362,977 A | 11/1994 | Hunt et al. | |
| 5,568,311 A | 10/1996 | Matsumoto | |
| 5,779,924 A | 7/1998 | Krames et al. | |
| 5,882,951 A | 3/1999 | Bhat | |
| 5,995,529 A | 11/1999 | Kurtz et al. | |
| 6,163,038 A | 12/2000 | Chen et al. | |
| 6,303,404 B1 | 10/2001 | Moon et al. | |
| 6,504,180 B1 | 1/2003 | Heremans et al. | |
| 6,525,464 B1 | 2/2003 | Chin | |
| 6,538,371 B1 | 3/2003 | Duggal et al. | |
| 6,608,330 B1 | 8/2003 | Yamada | |

(Continued)

FOREIGN PATENT DOCUMENTS

WO 2005064666 7/2005

OTHER PUBLICATIONS

H. Benisty et al., "Impact of Planar Microcavity Effects on Light Extraction—Part I: Basic Concepts and Analytical Trends," 1998, IEEE J. Quantum Electron, vol. 34:1612-1631.

(Continued)

*Primary Examiner*—Kevin M. Picardat
(74) *Attorney, Agent, or Firm*—Gates & Cooper LLP

(57) ABSTRACT

A structure using integrated optical elements is comprised of a substrate, a buffer layer grown on the substrate, one or more patterned layers formed on the buffer layer and one or more active layers formed on or between the patterned layers, for instance by Lateral Epitaxial Overgrowth (LEO), and including one or more light emitting species. The patterned layer comprises a mask (made of insulating, semiconducting or metallic material) and material filling holes in the mask. The patterned layer, due to a large index difference with the active layer and/or variations of a refractive index between the mask and materials filling holes in the mask, acts as an optical confinement layer, a mirror, a diffraction grating, a wavelength selective element, a beam shaping element or a beam directing element.

35 Claims, 14 Drawing Sheets

U.S. PATENT DOCUMENTS

| | | | |
|---|---|---|---|
| 6,611,003 B1 | 8/2003 | Hatakoshi et al. | |
| 6,620,238 B2 | 9/2003 | Tsuda et al. | |
| 6,620,643 B1 | 9/2003 | Koike | |
| 6,630,691 B1 | 10/2003 | Mueller-Mach et al. | |
| 6,657,236 B1 * | 12/2003 | Thibeault et al. | 257/98 |
| 6,743,648 B2 * | 6/2004 | Kise et al. | 438/22 |
| 6,903,379 B2 * | 6/2005 | Wang et al. | 257/98 |
| 7,012,279 B2 * | 3/2006 | Wierer, Jr. et al. | 438/32 |
| 7,037,742 B2 * | 5/2006 | Slater et al. | 438/39 |
| 7,078,735 B2 | 7/2006 | Shono et al. | |
| 7,098,589 B2 * | 8/2006 | Erchak et al. | 257/466 |
| 7,223,998 B2 | 5/2007 | Schwach et al. | |
| 2003/0057444 A1 | 3/2003 | Niki et al. | |
| 2003/0178626 A1 | 9/2003 | Sugiyama et al. | |
| 2005/0082545 A1 | 4/2005 | Wierer, Jr. et al. | |
| 2005/0205884 A1 | 9/2005 | Kim et al. | |
| 2006/0009006 A1 | 1/2006 | Murai et al. | |
| 2006/0175624 A1 | 8/2006 | Sharma et al. | |
| 2006/0192217 A1 | 8/2006 | David et al. | |
| 2006/0194359 A1 | 8/2006 | Weisbuch et al. | |
| 2006/0202226 A1 | 9/2006 | Weisbuch et al. | |
| 2006/0234486 A1 | 10/2006 | Speck et al. | |
| 2006/0246722 A1 | 11/2006 | Speck et al. | |
| 2007/0001186 A1 | 1/2007 | Murai et al. | |
| 2007/0085100 A1 | 4/2007 | Diana et al. | |
| 2007/0102721 A1 | 5/2007 | Denbaars et al. | |
| 2007/0121690 A1 | 5/2007 | Fujii et al. | |

OTHER PUBLICATIONS

M. Boroditsky et al., "Light-Emitting Diode Extraction Efficiency," 1997, Proceedings of the SPIE—The International Society for Optical Engineering, SPIE-Int. Soc. Opt. Eng., vol. 3002:119-122.

D. Delbeke et al., "High-Efficiency Semiconductor Resonant-Cavity Light-Emitting Diodes: A Review," 2002, IEEE J. on selected topic in Quant.turn Electronics, vol. 8(2):189-206.

N. Eriksson, et al., "Highly Directional Grating Outcouplers with Tailorable Radiation Characteristics," 1996, IEEE J. Quantum Electronics, vol. 32, No. 6, 1038-1047.

X. Guo et al., "Phonton Recycling Semiconductor Light Emitting Diode," 1999, IEDM, International Electron Devices Meeting, Technical Digest, IEDM-99, 600-603.

W. Lukosz, "Light emission by multipole sources in thin layers. I. Radiation patterns of electric and magnetic dipoles" 1981, J. Opt. Soc. Am., vol. 71: 744-754.

M. Rattier, et al., "Omnidirectional and compact guided light extraction from Archimedean photonic latticcs," 2003, Appl. Phys. Lett., vol. 83, No. 7: 1283-1285.

M. Rattier, et al., "Toward Ultrahigh-Efficiency Aluminum Oxide Microcavity Light- Emitting Diodes: Guided Mode Extraction by Photonic Crystals" 2002, IEEE Sel. Top. Quantum Electronics. vol. 8, No. 2: 238-247.

I. Schnitzer et al., "30% external quantum efficiency from surface textured, thin-film light emitting diodes," 1993, Applied Physics Letters, 63, No.: (16) 2174-2176.

T. Suhara, et al, "Broad area and MOPA lasers with integrated grating components for beam shaping and novel functions," 2003, Proc. SPIE vol. 4995, p. 10-21.

Kawakami Y. et al., "Dimensionality of Excitons in InGaN-Based Light Emitting Devices," Phys. Stat. Sol. (a) 178, 331 (2000).

Ohba, Y. et al., "A study on strong memory effects for Mg doping in GaN metalorganic chemical vapor deposition," J. of Cryst. Growth 145, pp. 214-218 (1994).

Chu, C.-F. et al., "Comparison of p-Side Down and p-Side Up GaN Light-Emitting Diodes Fabricated by Laser Lift-Off," Jpn. J. of Appl. Phys. vol. 42, pp. L147-L150 (2003).

Tavernier, P.R., et al., "Mechanics of laser-assisted debonding of films," J. of Appl. Phys. 89(3), pp. 1527-1536 (2001).

Wong, W.S. et al., "Fabrication of thin-film InGaN light-emitting diode membranes by laser-lift off," Appl. Phys. Lett. 75(10), pp. 1360-1362 (1999).

Cao, X.A. et al., "Electrical effects of plasma damage in p-GaN," Appl. Phys. Lett. 75(17), pp. 2569-2571 (1999).

Nishida, T. et al., "Efficient and high-power AlGaN-based ultraviolet light-emitting diode grown on bulk GaN," Appl. Phys. Lett. 79(6), pp. 711-712 (2001).

Billeb, A. et al., "Microcavity effects in GaN epitaxial films and in Ag/GaN/sapphire structures," Appl. Phys. Lett. 70 (21), pp. 2790-2792 (1997).

Wong, W.S. et al., "InxGa1-xN light emitting diodes on Si substrates fabricated by Pd-In metal bonding and laser lift-off," Appl. Phys. Lett. 77(18), pp. 2822-2824 (2000).

Wierer, J.J. et al., "High-power AlGaInN flip-chip light-emitting diodes," Appl. Phys. Lett. 78(22), pp. 3379-3381 (2001).

Minsky, M.S. et al., "Room-temperature photoenhanced wet etching of GaN," Appl. Phys. Lett. 68(11), pp. 1531-1533 (1996).

Youtsey, C. et al., "Gallium nitride whiskers formed by selective photoenhanced wet etching of dislocations," Appl. Phys. Lett. 73(6), pp. 797-799 (1998).

* cited by examiner

HORIZONTAL EMITTING, VERTICAL EMITTING, BEAM SHAPED, DISTRIBUTED FEEDBACK (DFB) LASERS BY GROWTH OVER A PATTERNED SUBSTRATE

CROSS-REFERENCE TO RELATED APPLICATIONS

This application is related to the following and commonly-assigned applications:

U.S. application Ser. No. 10/938,704, filed Sep. 10, 2004, by Carole Schwach, Claude C. A. Weisbuch, Steven P. DenBaars, Henri Benisty, and Shuji Nakamura, entitled "WHITE, SINGLE OR MULTI-COLOR LIGHT EMITTING DIODES BY RECYCLING GUIDED MODES,"

U.S. application Ser. No. 11/067,910 filed on Feb. 28, 2005, by Claude C. A. Weisbuch, Aurelien J. F. David, James S. Speck and Steven P. DenBaars, entitled "Single or multi-color high efficiency LIGHT EMITTING DIODE (LED) by growth over a patterned substrate," and, U.S. application Ser. No. 11/067,956, filed on Feb. 28, 2005, by Claude C. A. Weisbuch, Aureien J. F. David and Steven P. DenBaars, entitled "HIGH EFFICIENCY LIGHT EMITTING DIODE (LED) WITH OPTIMIZED PHOTONIC CRYSTAL EXTRACTOR,"

STATEMENT REGARDING SPONSORED RESEARCH AND DEVELOPMENT

The present invention was made under support from the University of California, Santa Barbara Solid State Lighting and Display Center member companies, including Stanley Electric Co., Ltd., Mitsubishi Chemical Corp., Rohm Co., Ltd., Cree, Inc., Matsushita Electric Works, Matsushita Electric Industrial Co., and Seoul Semiconductor Co., Ltd.

BACKGROUND OF THE INVENTION

1. Field of the Invention

This invention is related to lasers, and more particularly, to horizontal emitting, vertical emitting, beam shaped, distributed feedback (DFB) lasers by growth over a patterned substrate.

2. Description of the Related Art

A laser diode is a semiconductor device that emits light in a stimulated manner when electrically biased in the forward direction. The feedback required to reach auto-oscillation is provided by mirrors, usually obtained by cleaved facets, or by mirror-coated facets for horizontal in-plane lasers, or by dielectric multi-layer mirrors for vertical surface emitting lasers (VCSELs). Some lasers incorporate a dispersive element, such as a grating, providing distributed feedback (DFB) to achieve single mode emission.

Lasers generally comprise a chip of semiconducting material impregnated, or doped, with impurities to create a structure called a pn junction. When biased forwardly, electrons are injected into the junction from the n-region and holes are injected from the p-region, usually in a thin emitting layer called a quantum well (QW). The electrons and holes in the quantum well release energy in the form of photons as they recombine. The wavelength of the light, and therefore its color, depends on the bandgap energy of the materials forming the pn junction.

As semiconductor materials have improved, the efficiency of semiconductor devices has also improved and new wavelength ranges have been used. Gallium nitride (GaN) based lasers are probably the most promising in a variety of applications. GaN provides efficient illumination in the ultraviolet (UV) to amber spectrum when alloyed with varying concentrates of indium (In), for example.

Unfortunately, besides huge materials challenges, nitride lasers are difficult to manufacture. Cleaved facets have a low reflectivity, due to the low refractive index of nitrides. In addition, cleavage is hard to achieve because a sapphire substrate is typically used with nitride lasers.

To obtain good nitride lasers, it is necessary to obtain good mirrors using a planar fabrication technique. Other desirable properties include vertical emission, high power, single mode emission, etc. However, these properties, especially vertical emission, are extremely hard to obtain, as the high quality mirrors required for vertical cavity surface-emitting lasers (VCSELs) prove extremely difficult to manufacture.

The present invention aims at solving these challenges by using device growth techniques over a patterned substrate, wherein the pattern provides the function of a mirror, optical confinement layer, grating, wavelength selective element, beam shaping element or beam directing element.

SUMMARY OF THE INVENTION

The invention discloses an integrated optics structure, such as a laser, comprised of a sapphire substrate, a buffer layer formed of nitride materials, such as GaN, grown on the substrate, one or more patterned layers formed on the buffer layer and one or more active layers formed on or between the patterned layers, for example by Lateral Epitaxial Overgrowth (LEO), and including one or more light emitting species. Each patterned layer comprises a patterned, perforated or pierced mask (made of insulating, semiconducting or metallic material) and materials filling holes in the mask. The patterned layer, due to a large index difference with the active layer and/or variations of the refractive index between the mask and materials filling holes in the mask, acts as a mirror, optical confinement layer, grating, wavelength selective element, beam shaping element or beam directing element.

BRIEF DESCRIPTION OF THE DRAWINGS

Referring now to the drawings in which like reference numbers represent corresponding parts throughout.

DETAILED DESCRIPTION OF THE INVENTION

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Overview

The present invention describes new laser structures created using simplified fabrication processing. The simplified fabrication processing preferably comprises planar fabrication processing, which means that the laser structures can be easily manufactured at low cost.

Preferably, the laser structure is comprised of a substrate, a buffer layer grown on the substrate, one or more patterned layers deposited on the buffer layer and comprising a patterned, perforated or pierced mask (made of insulating, semiconducting or metallic material) and materials filling holes in the mask, and one or more active layers grown on or between the patterned layers, for example by Lateral Epitaxial Overgrowth (LEO), and including one or more light emitting species. The patterned layer, due to a high index difference with the active layer material and/or variations in the refractive index between the mask and materials filling holes in the mask, acts as an optical confinement layer, an efficient mirror (e.g., a so-called photonic crystal mirror), a diffraction grating towards the surface (e.g., an outcoupler), a wavelength selective (distributed feedback) element, a beam shaping element, or a beam directing element.

The mask of the patterned layer is perforated or pierced by an array of small holes, and thus can act as a growth mask for the active layer, which yields high quality epitaxial material in the subsequent LEO growth of the active layer. Moreover, a plurality of patterned layers can be used to ensure better materials and opto-electronic properties.

For example, the lasers can emit horizontally in the device plane if the patterned layer acts as a mirror, or emit vertically outside the device plane by having guided light shaped into extracted light, if the patterned layer acts as a buried diffraction grating. Further, a patterned layer that is a buried grating can perform as a distributed feedback (DFB) grating for single wavelength emission. In addition, the patterned layer can perform as a beam shaping or directing element.

Technical Description

Figure 1A:
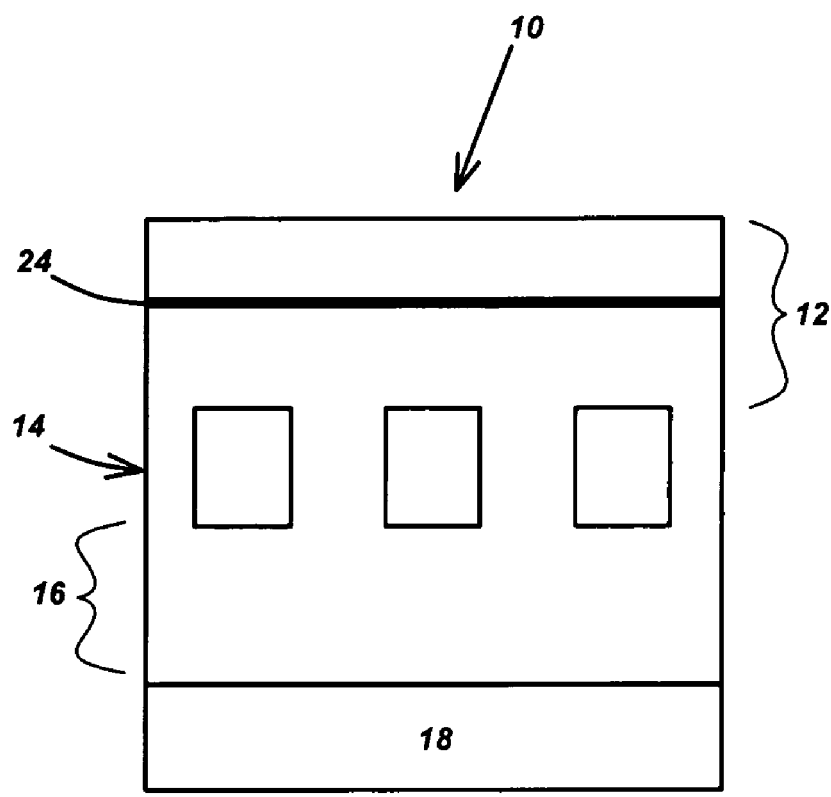
FIG. 1A is a cross-sectional side view and FIG. 1B is a top plan view of a laser device according to a preferred embodiment of the present invention.
Figure 1B:
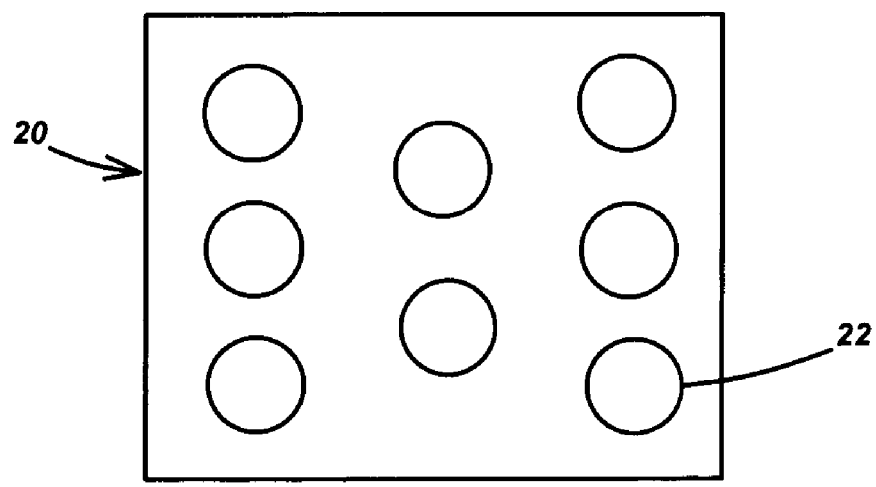

FIG. 1A is a cross-sectional side view and FIG. 1B is a top plan view of a laser device 10 with a 300 nm active layer 12 comprised of a nitride material such as GaN formed on a 300 nm patterned layer 14, which is deposited on a 5 micron buffer layer 16 comprised of a nitride material such as GaN, which is grown on a substrate 18 comprised of sapphire. The patterned layer 14 is formed of a patterned, pierced or perforated mask 20 of $SiO_2$ with a nitride material such as GaN filling the holes 22 of the mask 20.

The patterned layer 14 uses the patterned $SiO_2$ mask 20 as an essential component to define the laser and its components. Specifically, the patterned layer 14 has a large average index difference with the active layer 12 and/or the patterned layer 14 has variations in a refractive index between the patterned mask 20 and materials filling holes 22 in the patterned mask 20, such that the patterned layer 14 acts as a mirror, optical confinement layer, grating, wavelength selective element, beam shaping element or beam directing element. The laser 10 therefore requires the specific design of the patterned layer 14 and a precisely grown thin active GaN layer 12 with optimally-positioned light emitting species, such as quantum wells 24.

Figure 2:
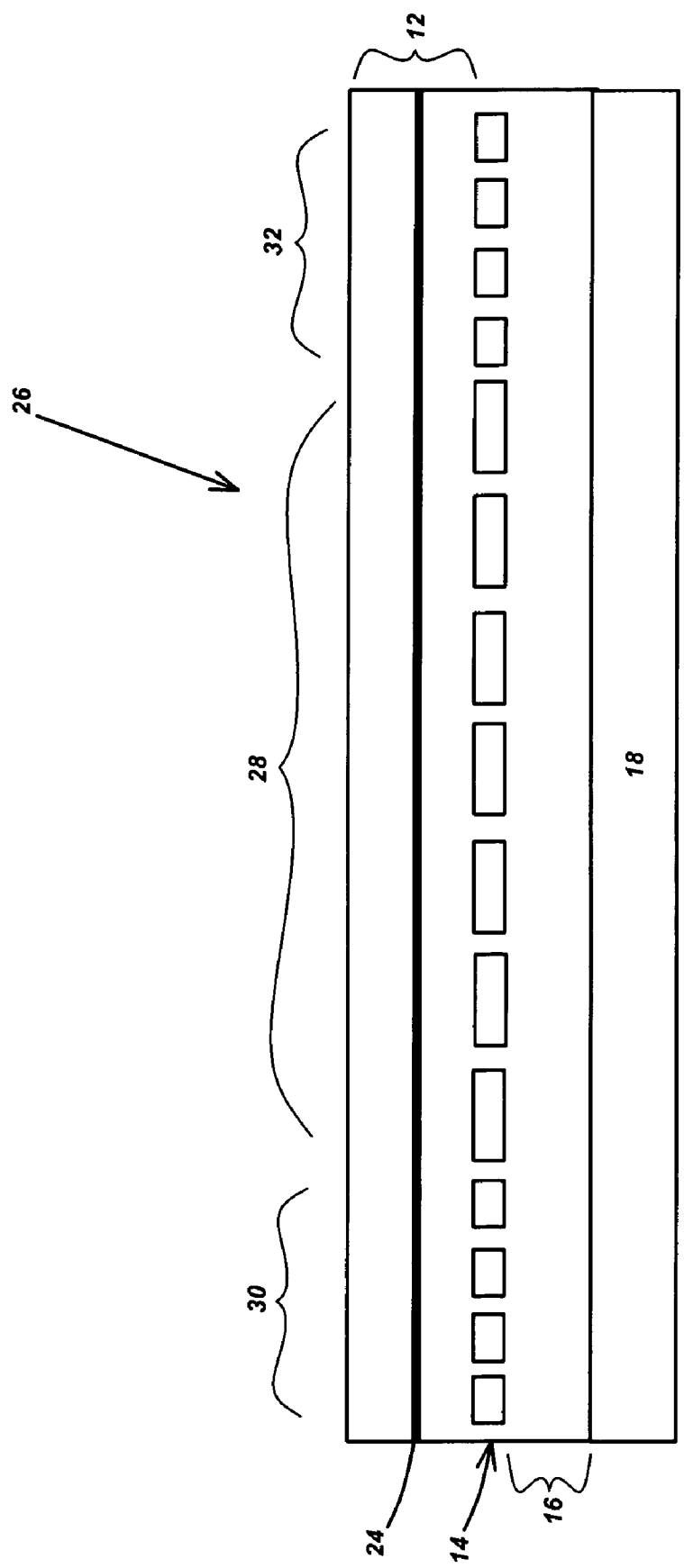
FIG. 2 is a cross-sectional side view of a laser with separate gain and mirror regions according to a preferred embodiment of the present invention.

FIG. 2 is a cross-sectional side view of a laser 26 with separate gain 28 and mirror 30, 32 regions having different patterns in the patterned layer 14. The modulation of the index of refraction in regions 30, 32 of the patterned layer 14 in this structure performs as a mirror, thus providing the feedback for laser auto-oscillation. This can be obtained by having suitable parameters of the patterned layer 14.

Figure 3:
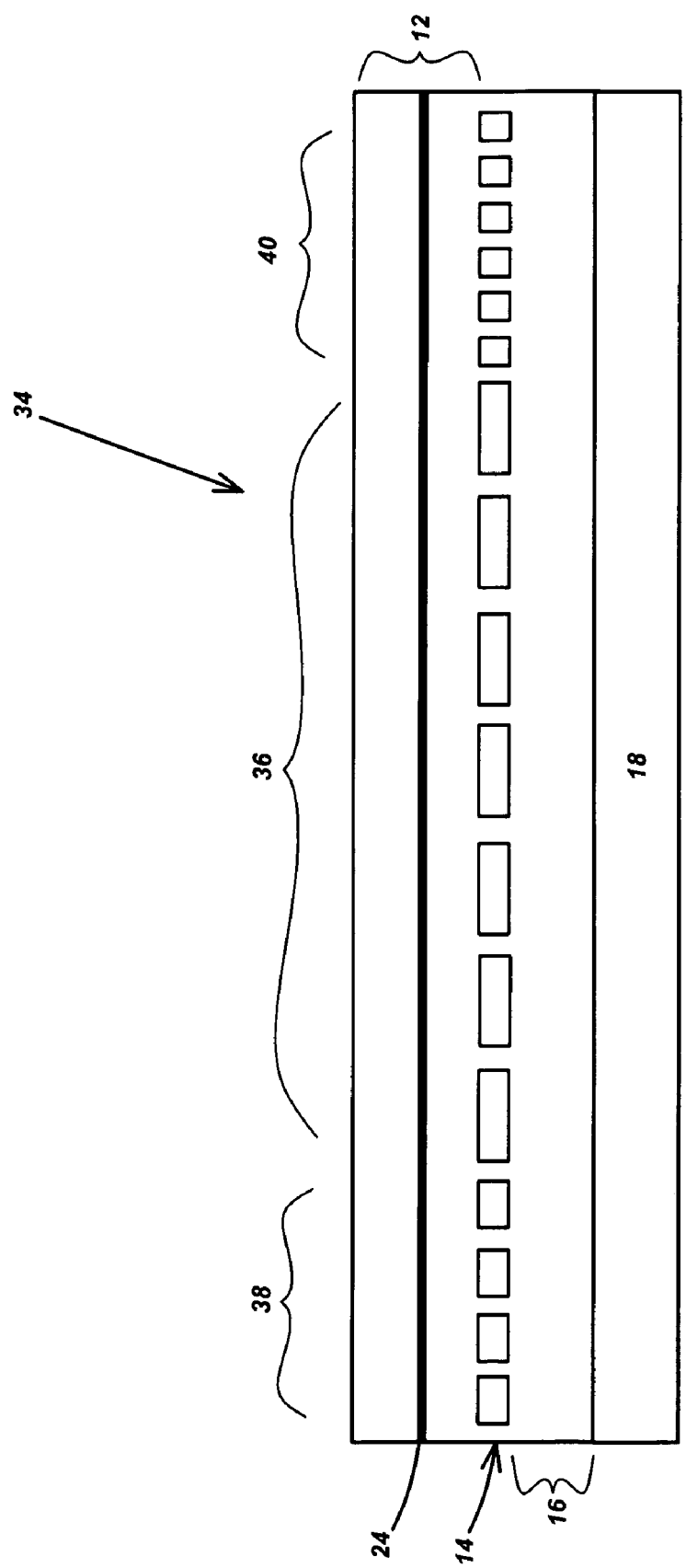
FIG. 3 is a cross-sectional side view of a laser with separate gain, mirror and diffracting outcoupling mirror regions according to a preferred embodiment of the present invention.

FIG. 3 is a cross-sectional side view of a laser 34 with separate gain 36, mirror 38 and diffracting outcoupling mirror 40 regions having different patterns in the patterned layer 14. Outcoupling occurs through diffraction of light by region 40 towards the air, provided that the right diffraction conditions are fulfilled.

Figure 4:
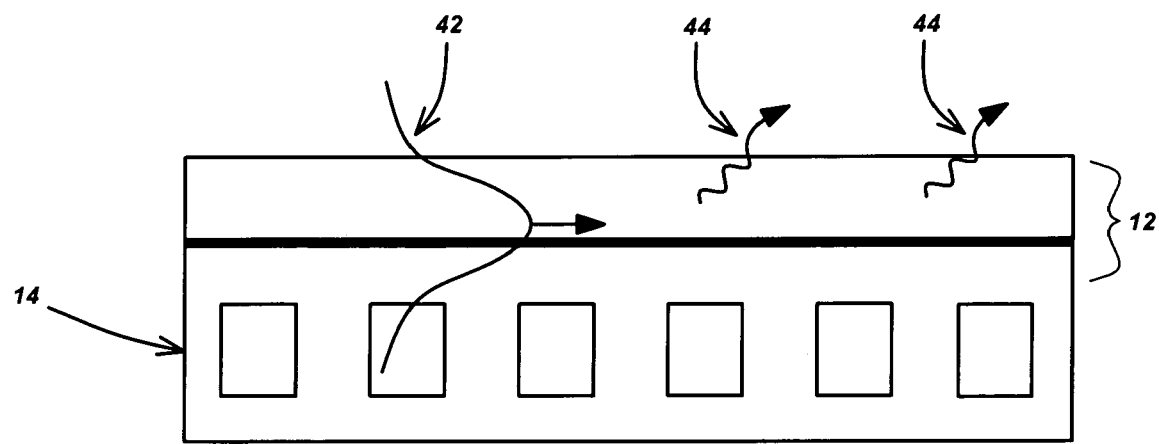
FIG. 4 is a cross-sectional side view illustrating light extraction of the laser guided mode by diffraction by a patterned layer acting as a diffraction grating according to a preferred embodiment of the present invention.

FIG. 4 is a cross-sectional side view illustrating light extraction from the laser from guided modes by diffraction by the patterned layer 14. At least a portion of the patterned layer 14 acts as a diffraction grating and the laser 10 emits guided light outside a device plane by having guided light 42 shaped into extracted light 44 using the diffraction grating.

Parameters of the active layer 12 and patterned layer 14 can be varied from structure to structure, or varied across one structure, to produce different functions (e.g., an in-plane mirror, extracting grating and/or waveguiding). The parameters include the thickness of the active layer 12 and patterned layer 14, as well as the shape, size and/or period of the holes in the patterned layer 14. For example, the patterned layer 14, due to a large index difference with the active layer 12, modifies an emission pattern of the light emitting species in the active layer 12, in order to increase or decrease the relative amount of light emitted in guided, radiative or leaky modes.

Moreover, one or more properties of the patterned layer 14 may be spatially varied across the structure. These properties of the patterned layer 14 can comprise thickness, radius of the holes 22 in the mask 20, shape of the holes 22 in the mask 20, periodicity of a pattern of holes 22 in the mask 20, or non-periodicity of a pattern of holes 22 in the mask 20, etc.

Figure 5:
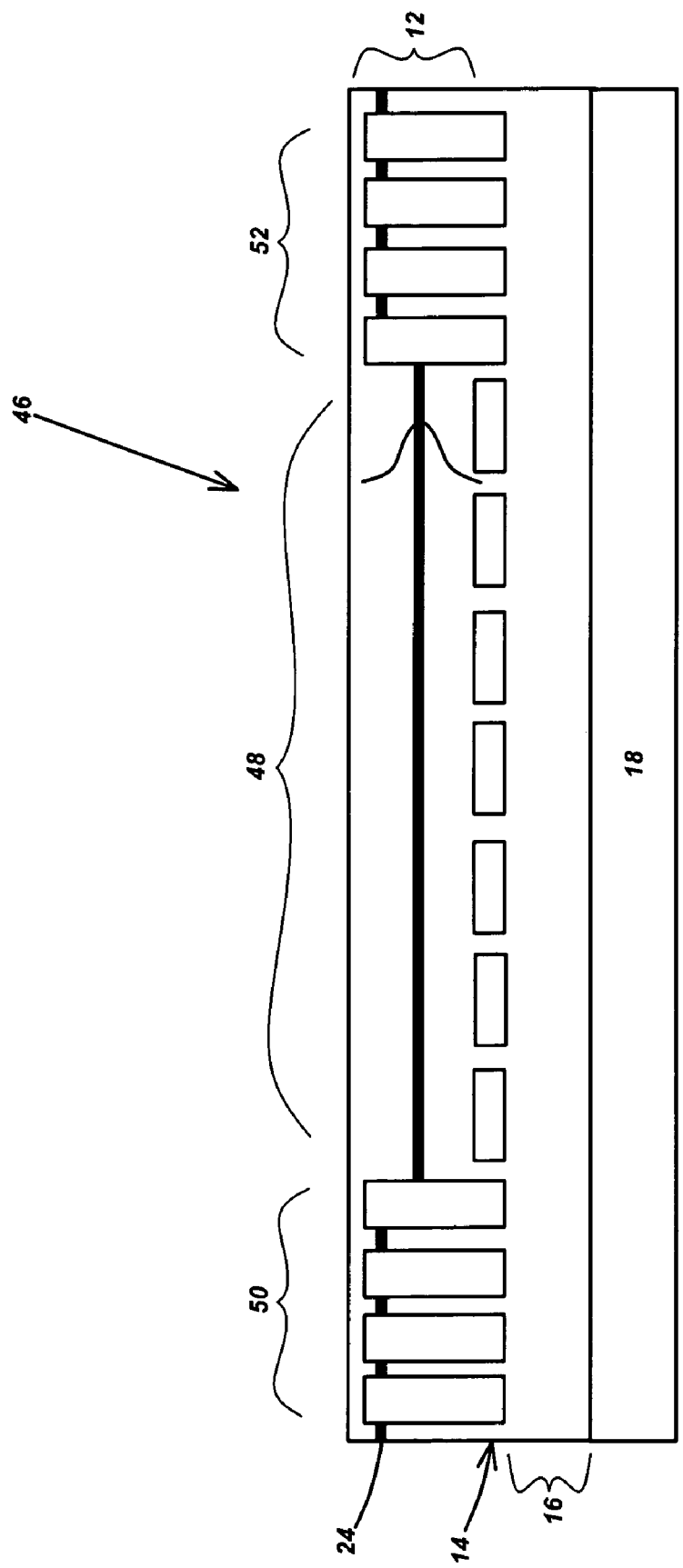
FIG. 5 is a cross-sectional side view of a laser with separate gain, mirror and extraction regions, with varying growth depths defined by the etching of the patterned layer, according to a preferred embodiment of the present invention.

FIG. 5 is a cross-sectional side view of a laser 46 with separate gain 48 and mirror 50, 52 regions, with varying growth depths defined by the etching of the mask of the patterned layer 14. In addition to the added design possibilities offered by the varying $SiO_2$ thickness of the mask of the patterned layer 14, the mask functions as a growth mask for the active layer 12, which is grown by LEO, such that control of growth speed through hole diameter of the patterned layer 14 and growth conditions allows diminished overlap of the guided mode with the active layer 12 materials (i.e., quantum wells 24) within the mirrors 50, 52, where the quantum wells 24 can be displaced vertically or compositionally, thus diminishing the absorption loss in the mirrors 50, 52, which is a highly desirable feature. Specifically, the patterned layer 14 comprises confining regions 50, 52 having designed growth such that absorption is diminished or suppressed in regions adjacent to an amplifying region 48.

Figure 6:
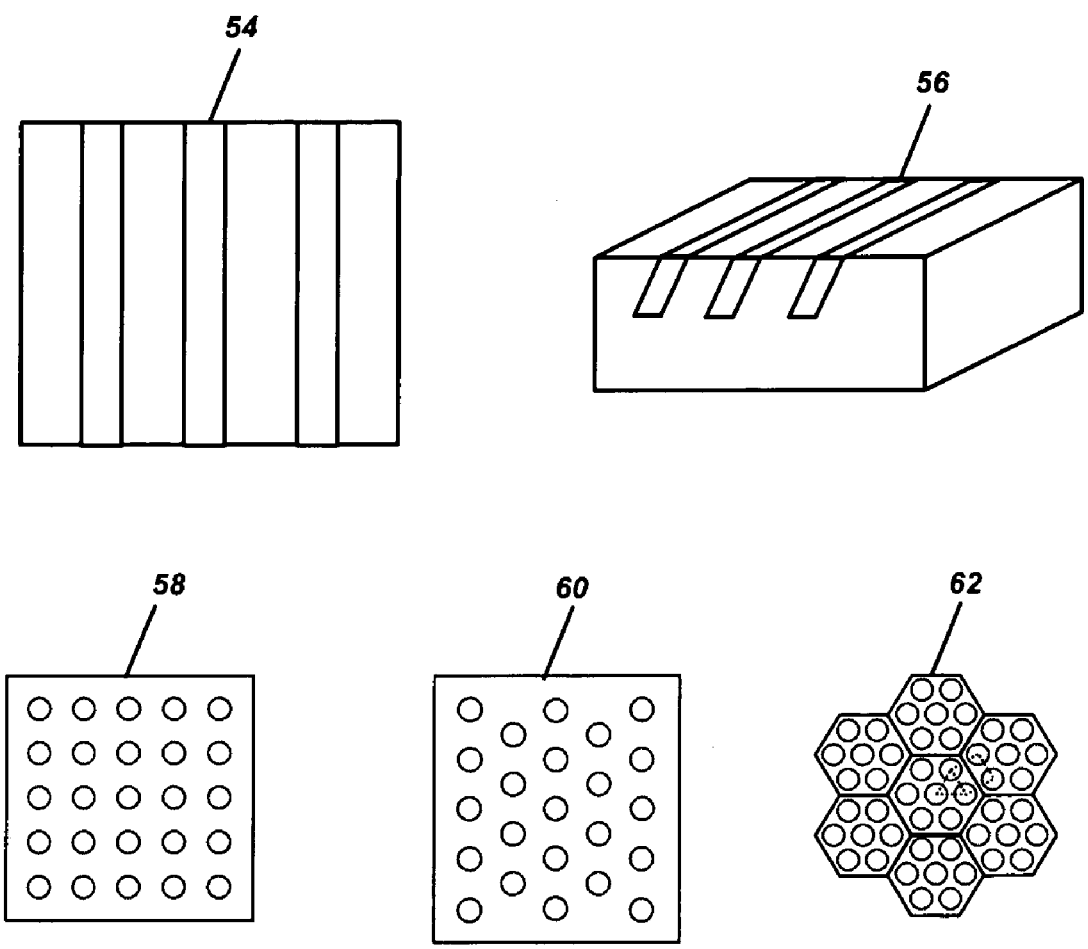
FIG. 6 illustrates various geometries that can be used as for the patterns, perforations or piercings in the mask of the patterned layer, according to a preferred embodiment of the present invention.

Various geometries can be used as for the patterns, perforations or piercings in the patterned layer 14. The simplest geometries are trenches of various periods and filling factors, which may be linear or shaped, illustrated as 54 and 56 in FIG. 6. The geometries can also use holes organized in square or rectangular arrays, e.g., so-called periodic photonic crystals, illustrated as 58 and 60, respectively, in FIG. 6. More complex geometries also lead to more efficient light extraction, such as Archimedean tilings, illustrated as 62 in FIG. 6. Finally, even random patterns with a characteristic correlation length in the vicinity of the wavelength can also act as efficient light outcouplers. The vertical shape of the holes can also be used as a design parameter, for instance providing a blaze effect, illustrated as 56 in FIG. 6.

Figure 7:
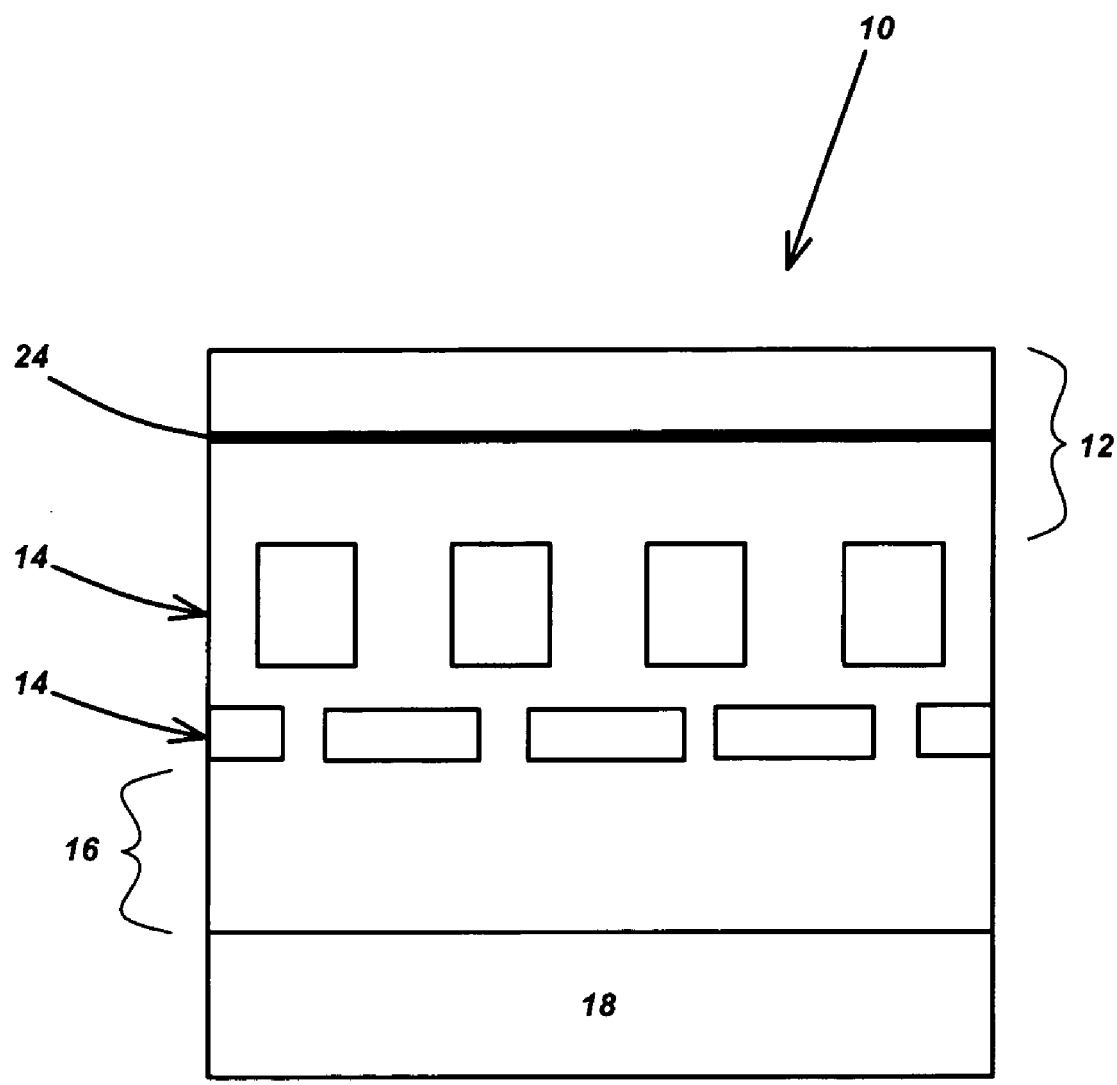
FIG. 7 is a cross-sectional side view of the active region of a device having a plurality of patterned layers according to a preferred embodiment of the present invention.

There are various types of lasers that can be fabricated using the present invention, and many possible implementations of such lasers. For example, a plurality of patterned layer 14 growths can be used to improve the materials quality, as shown in FIG. 7, which is a cross-sectional side view of the active region of a device 10 having a plurality of patterned layers 14.

In another example, the mask of the patterned layers 14 can be made of various materials, including metals, dielectrics or semiconductors. What is required is that the index of refraction for the patterned layer 14 is different enough from that of the active layer 12 and allows high quality LEO.

In yet another example, using a patterned layer 14 with the proper design (i.e. period), at least a portion of the patterned layer 14 acts as a distributed feedback (DFB) grating for single wavelength emission of light from the laser 10, wherein the DFB action is obtained from the gain region so that the laser 10 emits in a single mode.

Figure 8:
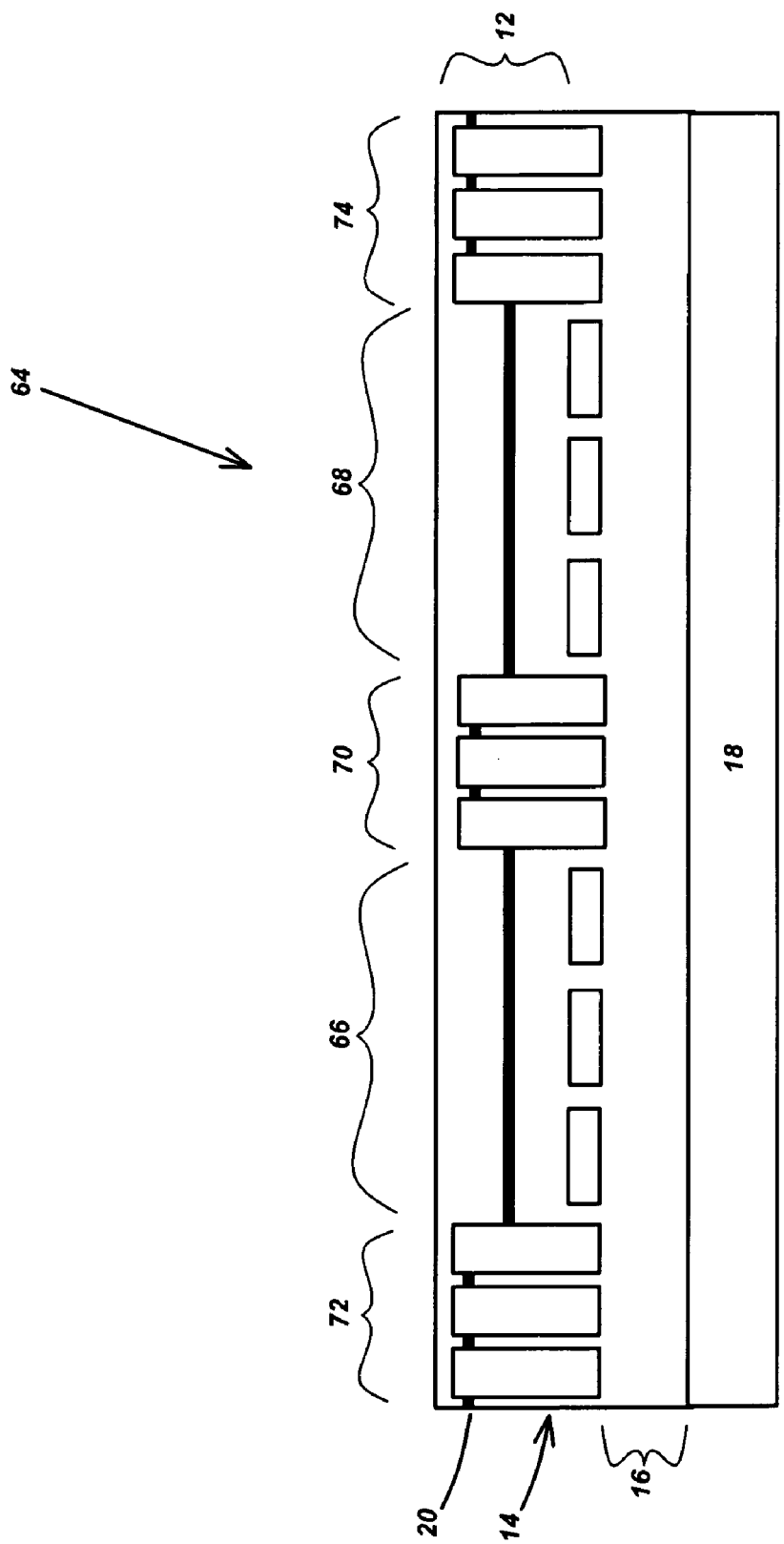
FIG. 8 is a cross-sectional side view of a coupled-cavity laser according to a preferred embodiment of the present invention.

FIG. 8 illustrates a laser 64 having first and second laser cavities 66, 68 positioned on opposite sides of a coupling mirror 70 and between first and second mirrors 72, 74. In this embodiment, the patterned layer 14 defines a plurality of coupled cavities 66, 68 that comprise a compound cavity with new spectral properties. For example, this laser 64 could be used to achieve single-mode operation.

Figure 9:
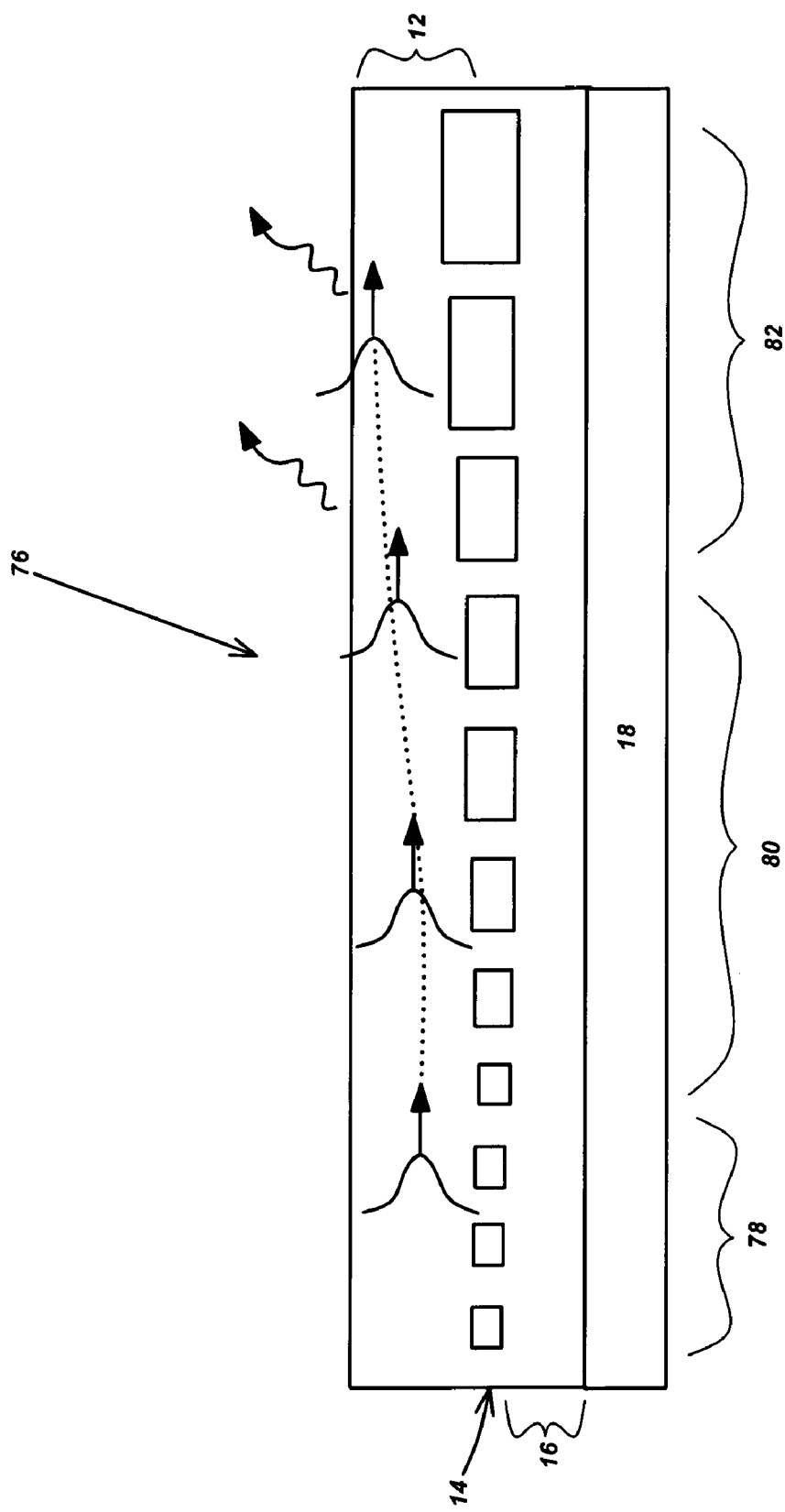
FIG. 9 is a cross-sectional side view of an anti-reflection (AR) outcoupler of a master oscillator power amplifier (MOPA) according to a preferred embodiment of the present invention.

Another useful device is a master oscillator power amplifier (MOPA), which is a high-power light source. The various elements of the MOPA can be designed in the patterned layer 14: master oscillator (MO) back mirror and coupling mirror, power amplifier (PA) active region, and anti-reflection (AR) outcoupler. (See, e.g., the Suhara et al. publication set forth below for a device description.) FIG. 9 is a cross-sectional side view of an AR outcoupler 76 of a MOPA, which is comprised of an initial region 78, anti-reflection region 80 that performs mode conversion with reflection, and vertical extractor 82 that is the final outcoupler.

For the amplifying region of the MOPA, the patterned mask of the patterned layer 14 can be used to define index guiding by having a varying mask filling factor, which in turns translates into a map of effective index.

Figure 10A:
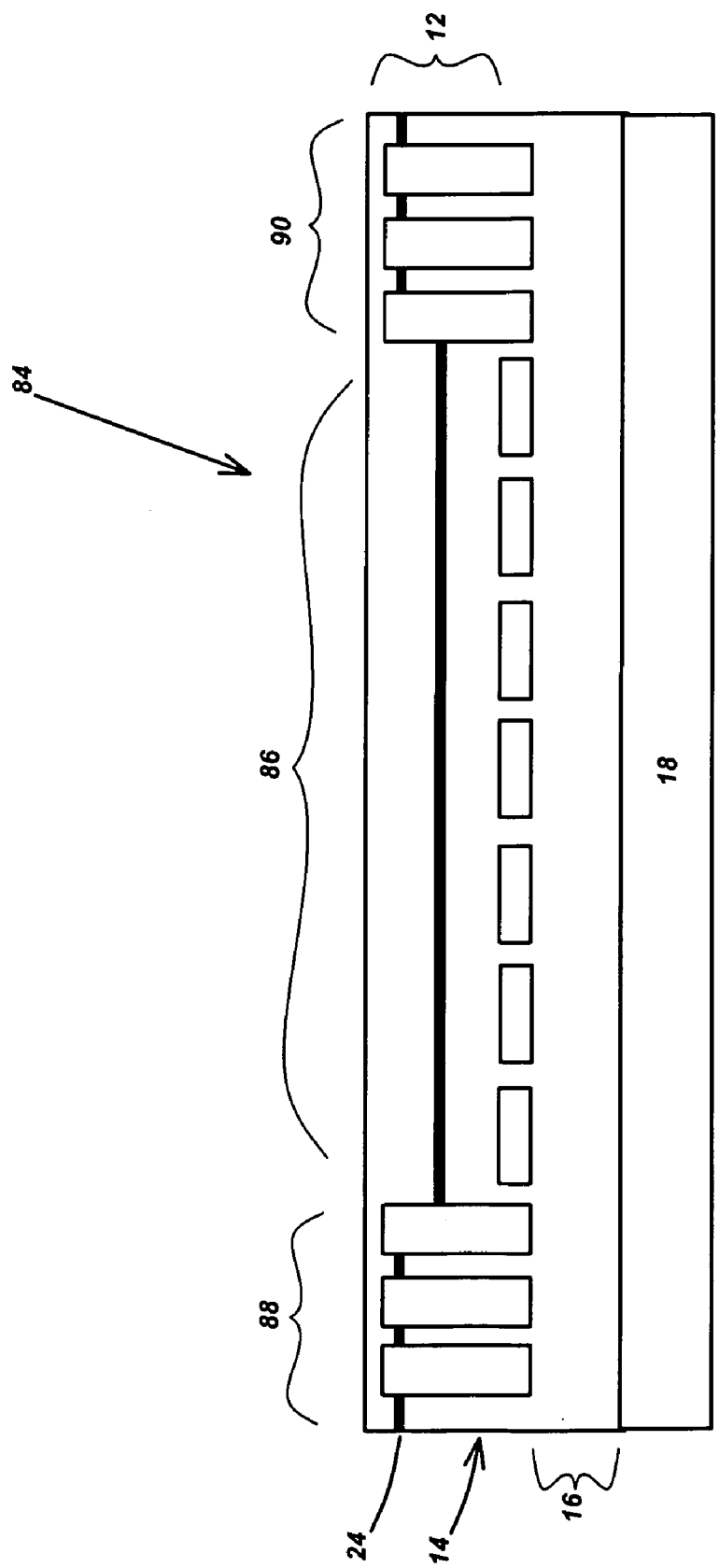
FIG. 10A is a cross-sectional side view and FIG. 10B is a top plan view of a transverse waveguiding portion of a master oscillator power amplifier (MOPA) according to a preferred embodiment of the present invention.

FIG. 10A is a cross-sectional side view of a transverse waveguiding portion 84 of the MOPA, which includes an amplifying or gain region 86 and confining regions 88, 90. These confining regions 88, 90 can possibly have designed growth such that quantum well 24 absorption is diminished or suppressed in the regions 88, 90 adjacent to the amplifying region 86.

Figure 10B:
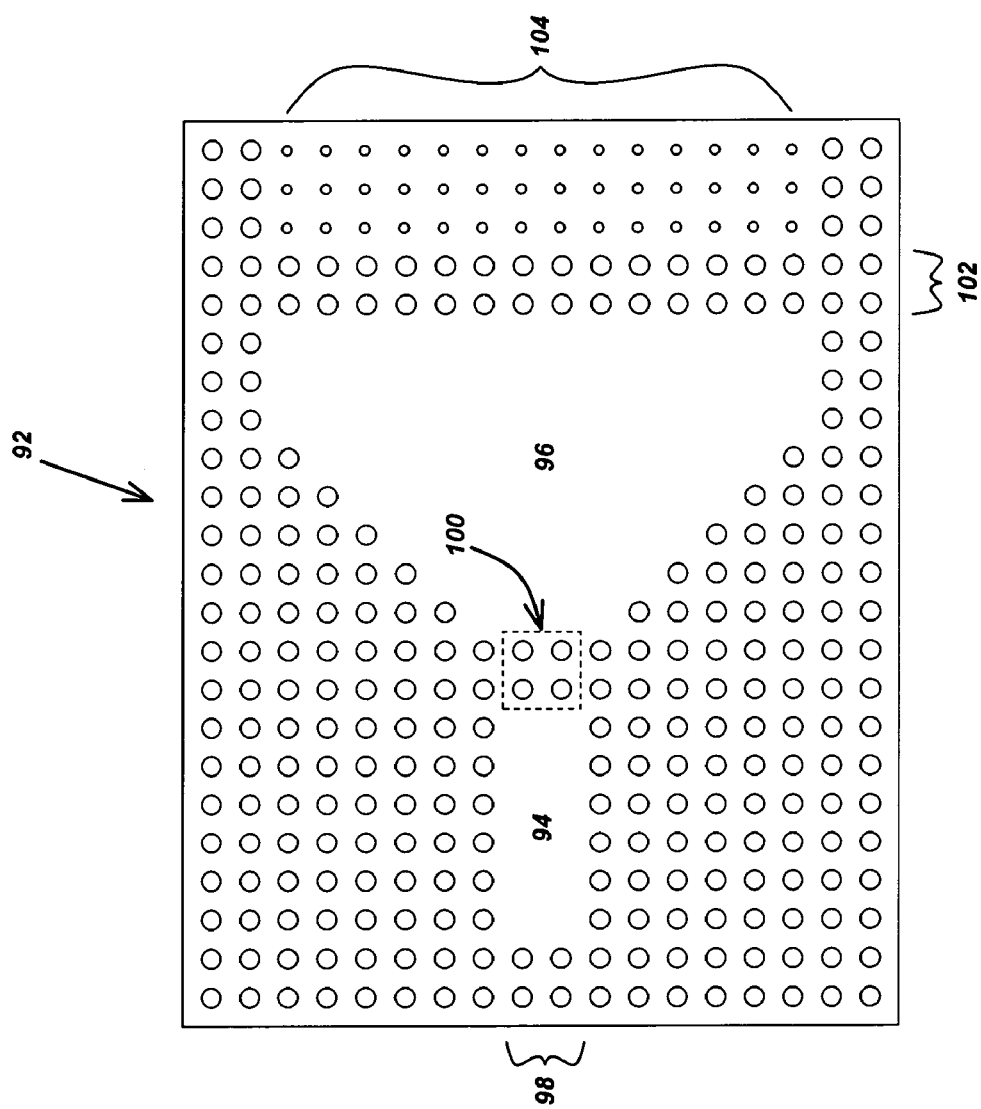

FIG. 10B is a top plan view of a MOPA 92, which shows master oscillator 94, power amplifier 96, rear reflector 98, intermediate mirror 100, anti-reflective mirror 102 and outcoupler 104.

Another embodiment of the present invention uses light conversion, wherein the laser 10 further comprises one or more secondary light emitting species that absorb and re-emit at least a portion of the light. The light emitted by the laser, or part of that light, can be absorbed by the secondary light emitting species, and then re-emitted at a different wavelength. This can, for example, be useful to produce white light sources. The secondary light emitting species can be placed in the active layer of the laser, in the material filling the holes in the patterned mask, or in other additional layers of the device.

While having been described with the example of nitride materials, this new laser fabrication scheme can be applied to any material that is amenable to such a growth technique. For example, in the structures described above, the various layers may be comprised of semiconductors, polymers, metals, ion-doped materials or organic molecules. Moreover, in semiconductor materials, the active region 12 can be quantum wells 24 as described, but also bulk materials or quantum wires or dots may be used.

Another large field of applications of this concept of designed overgrowth is that of integrated optics. The lateral modulation of the average effective modal index allowed by varying filling factor of the patterned layer, or by laterally varying the depth of the patterned layer leads to efficient low loss waveguiding, with many accessible design parameters. In addition, the periodic nature of the perforations can be used to rely on waveguiding through photonic bandgap effects. The power of the present implementation of integrated optics is that the active part of the devices is grown after the most critical fabrication step has been done, that of lithography and etching of the patterns.

Figure 11:
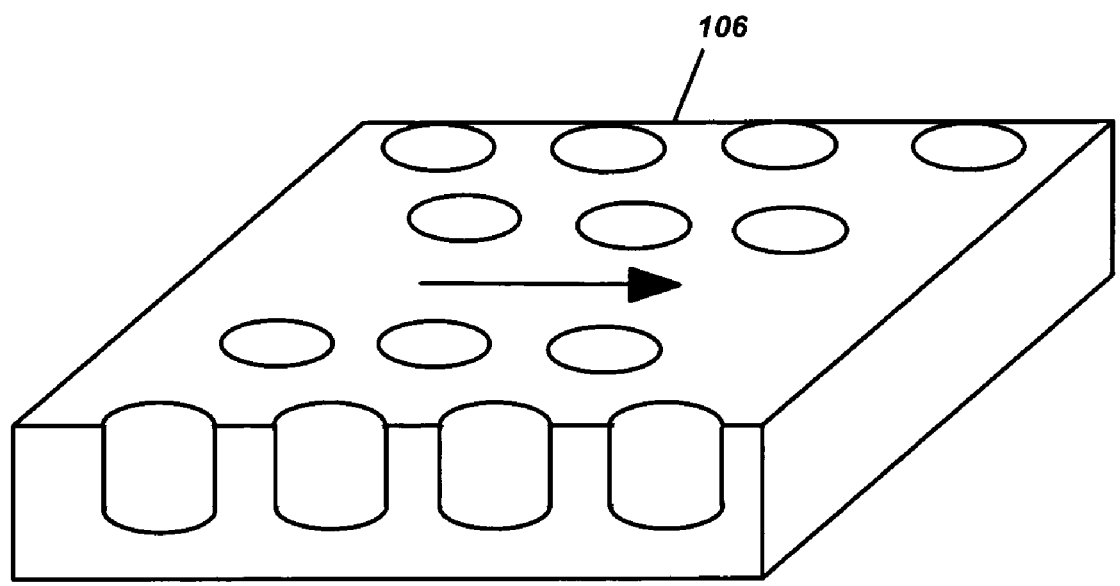
FIG. 11 is a perspective side view that illustrates waveguiding by a variation of silica coverage according to a preferred embodiment of the present invention.

FIG. 11 is a perspective side view that illustrates waveguiding 106 by a variation of silica coverage (in this case, silica columns). There can be missing columns, as in the figure, or variable periods, or variable fill factors. The pattern of varying silica contents creates a varying landscape for the index of refraction, which will confine and guide light propagating in the GaN waveguide grown on top of this structure 106.

Figure 12:
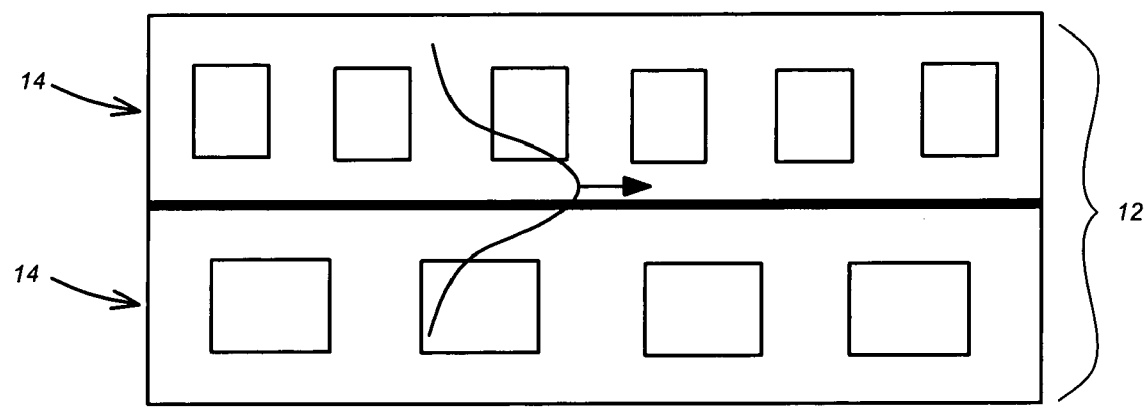
FIG. 12 is a cross-sectional side view of a laser cavity defined between two patterned layers according to a preferred embodiment of the present invention.

FIG. 12 is a cross-sectional side view that illustrates the use of two patterned layers 14, one on each side of the active layer 12 region, in order to further confine the guided mode in the vertical direction. This can be useful as the mode of the laser should not overlap with regions of strong absorption, such as Mg-doped regions in the case of GaN-based laser diode.

Figure 13:
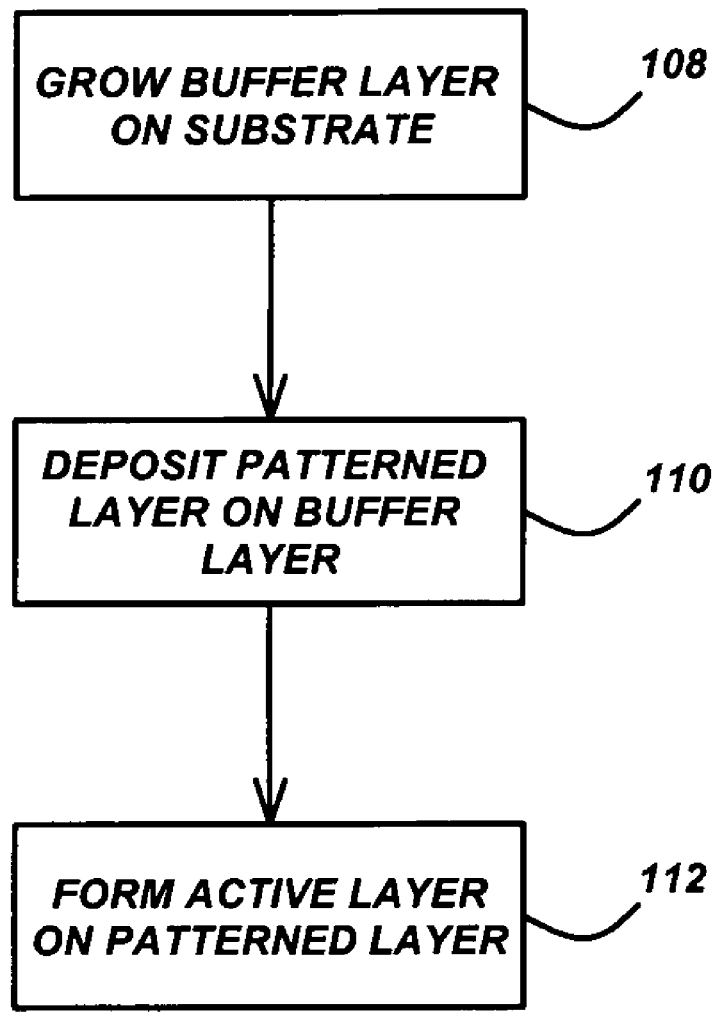
FIG. 13 is a flowchart illustrating the fabrication steps performed according to a preferred embodiment of the present invention.

Finally, FIG. 13 is a flowchart illustrating the fabrication steps performed according to a preferred embodiment of the present invention.

Block 108 represents the step of growing a buffer layer on a substrate. Preferably, the substrate is sapphire and the buffer layer is a nitride material.

Block 110 represents the step of depositing one or more patterned layers on top of the buffer, wherein each patterned layer is comprised a mask and materials filling holes in the patterned mask. Preferably, the patterned layers are nitride materials, the mask is comprised of an insulating, semiconducting or metallic material, and the materials filling holes in the mask are nitride materials. Each patterned layer acts as a mirror, optical confinement layer, grating, wavelength selective element, beam shaping element or beam directing element for the active layers.

Block 112 represents the step of forming one or more active layers on or between the patterned layers, wherein the active layers may include one or more light emitting species. Preferably, the active layers are nitride materials and are grown by LEO, wherein the mask functions as a growth mask for the active layers.

The end result of these steps is a structure using integrated optical elements, such as a laser, comprised of a substrate, a buffer layer grown on the substrate, one or more patterned layers deposited on top of the buffer, wherein each of the patterned layers is comprised of a mask and materials filling holes in the mask, and one or more active layers formed on or between the patterned layers, wherein the active layers may include of one or more light emitting species.

REFERENCES

The following references are incorporated by reference herein:

1. N. Eriksson, M. Hagberg and A. Larsson, "Highly directional grating outcouplers with tailorable radiation characteristics," IEEE J. Quant. Electronics, vol. 32, 1038 (1996).
2. T. Suhara, M. Uemukai, N. Shimada and A. Larsson, "Broad area and MOPA lasers with integrated grating components for beam shaping and novel functions," Proc. SPIE vol. 4995, 10 (2003).

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A structure using integrated optical elements, comprising:
   (a) a substrate;
   (b) a buffer layer grown on the substrate;
   (c) one or more patterned layers deposited on top of the buffer layer, wherein each of the patterned layers is comprised of a mask and materials filling holes in the mask; and
   (d) one or more active layers formed on or between the patterned layers;
   (e) wherein each patterned layer acts as a mirror, optical confinement layer, grating, wavelength selective element, beam shaping element or beam directing element for the active layers.

2. The structure of claim 1, wherein the active layers include one or more light emitting species.
3. The structure of claim 2, further comprising one or more secondary light emitting species that absorb and re-emit at least a portion of the light.
4. The structure of claim 1, wherein the patterned layer has a large average index difference with the active layer.
5. The structure of claim 1, wherein at least a portion of the patterned layer acts as a diffraction grating and the structure emits guided light outside a device plane by having guided light shaped into extracted light using the diffraction grating.
6. The structure of claim 1, wherein at least a portion of the patterned layer acts as a distributed feedback (DFB) grating for single wavelength emission of light from the structure.
7. The structure of claim 1, wherein the patterned layer defines a plurality of coupled cavities.
8. The structure of claim 1, wherein the patterned layer, due to a large index difference with the active layer, modifies an emission pattern of light emitting species in the active layer, in order to increase or decrease a relative amount of light emitted in guided, radiative or leaky modes.
9. The structure of claim 1, wherein the patterned layer includes a master oscillator (MO) back mirror and coupling mirror, power amplifier (PA) active region, and anti-reflection (AR) outcoupler, and the anti-reflection outcoupler comprises an initial region, anti-reflection region that performs mode conversion with reflection, and vertical extractor that is a final outcoupler.
10. The structure of claim 1, wherein the patterned layer comprises confining regions having designed growth such that absorption is diminished or suppressed in regions adjacent to an amplifying region.
11. The structure of claim 1, wherein the substrate is sapphire and the buffer layer, patterned layer and active layer are nitride materials.
12. The structure of claim 1, wherein the active layers are grown by Lateral Epitaxial Overgrowth (LEO).
13. The structure of claim 1, wherein the mask is comprised of an insulating, semiconducting or metallic material.
14. The structure of claim 1, wherein the mask functions as a growth mask for the active layers.
15. The structure of claim 1, wherein the patterned layer has variations in a refractive index between the mask and materials filling holes in the mask.
16. The structure of claim 1, wherein the materials filling holes in the mask are nitride materials.
17. The structure of claim 1, wherein one or more properties of the patterned layer are spatially varied across the structure, and the properties of the patterned layer comprise thickness, radius of the holes in the mask, shape of the holes in the mask, periodicity of a pattern in the mask, or non-periodicity of a pattern in the mask.
18. A method of fabricating a structure using integrated optical elements, comprising:
   (a) growing a buffer layer on a substrate;
   (b) depositing one or more patterned layers on top of the buffer layer, wherein each of the patterned layers is comprised of a mask and materials filling holes in the mask; and
   (c) forming one or several active layers on or between the patterned layers;
   (d) wherein each patterned layer acts as a mirror, optical confinement layer, grating, wavelength selective element, beam shaping element or beam directing element for the active layers.

19. The method of claim 18, wherein the active layers include one or more light emitting species.

20. The method of claim 19, further comprising growing one or more secondary light emitting species that absorb and re-emit at least a portion of the light.

21. The method of claim 18, wherein the patterned layer has a large average index difference with the active layer.

22. The method of claim 18, wherein at least a portion of the patterned layer acts as a diffraction grating and the structure emits guided light outside a device plane by having guided light shaped into extracted light using the diffraction grating.

23. The method of claim 18, wherein at least a portion of the patterned layer acts as a distributed feedback (DFB) grating for single wavelength emission of light from the structure.

24. The method of claim 18, wherein the patterned layer defines a plurality of coupled cavities.

25. The method of claim 18, wherein the patterned layer, due to a large index difference with the active layer, modifies an emission pattern of light emitting species in the active layer, in order to increase or decrease a relative amount of light emitted in guided, radiative or leaky modes.

26. The method of claim 18, wherein the patterned layer includes a master oscillator (MO) back mirror and coupling mirror, power amplifier (PA) active region, and anti-reflection (AR) outcoupler, and the anti-reflection outcoupler comprises an initial region, anti-reflection region that performs mode conversion with reflection, and vertical extractor that is a final outcoupler.

27. The method of claim 18, wherein the patterned layer comprises confining regions having designed growth such that absorption is diminished or suppressed in regions adjacent to an amplifying region.

28. The method of claim 18, wherein the substrate is sapphire and the buffer layer, patterned layer and active layer are nitride materials.

29. The method of claim 18, wherein the active layers are grown by Lateral Epitaxial Overgrowth (LEO).

30. The method of claim 18, wherein the mask is comprised of an insulating, semiconducting or metallic material.

31. The method of claim 18, wherein the mask functions as a growth mask for the active layers.

32. The method of claim 18, wherein the patterned layer has variations in a refractive index between the mask and materials filling holes in the mask.

33. The method of claim 18, wherein the materials filling holes in the mask are nitride materials.

34. The method of claim 18, wherein one or more properties of the patterned layer are spatially varied across the structure, and the properties of the patterned layer comprise thickness, radius of the holes in the mask, shape of the holes in the mask, periodicity of a pattern in the mask, or non-periodicity of a pattern in the mask.

35. A structure fabricated using the method of claim 18.

* * * * *